(12) United States Patent
Feng et al.

(10) Patent No.: US 9,041,137 B2
(45) Date of Patent: *May 26, 2015

(54) LIGHT EMITTING DIODE

(71) Applicant: Beijing FUNATE Innovation Technology Co., LTD., Beijing (CN)

(72) Inventors: Chen Feng, Beijing (CN); Li Qian, Beijing (CN); Yu-Quan Wang, Beijing (CN)

(73) Assignee: Beijing FUNATE Innovation Technology Co., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 13/866,408

(22) Filed: Apr. 19, 2013

(65) Prior Publication Data

US 2014/0091352 A1  Apr. 3, 2014

(30) Foreign Application Priority Data

Sep. 28, 2012  (CN) .................. 2012 1 0368199 4

(51) Int. Cl.

| H01L 29/12 | (2006.01) |
| H01L 33/40 | (2010.01) |
| H01L 33/42 | (2010.01) |
| B82Y 99/00 | (2011.01) |
| H01L 29/06 | (2006.01) |
| H01L 51/00 | (2006.01) |
| H01L 51/52 | (2006.01) |
| B82Y 30/00 | (2011.01) |
| B82Y 20/00 | (2011.01) |

(52) U.S. Cl.
CPC ............. *H01L 33/40* (2013.01); *Y10S 977/742* (2013.01); *B82Y 99/00* (2013.01); *H01L 29/0673* (2013.01); *H01L 51/0048* (2013.01); *H01L 51/5203* (2013.01); *H01L 33/42* (2013.01); *B82Y 30/00* (2013.01); *B82Y 20/00* (2013.01)

(58) Field of Classification Search
CPC .............. H01L 33/387; H01L 51/5203; H01L 51/0048
USPC ............................................. 257/448, E21.09
See application file for complete search history.

(56) References Cited

U.S. PATENT DOCUMENTS

| 2008/0170982 A1* | 7/2008 | Zhang et al. ............... 423/447.3 |
| 2009/0296528 A1* | 12/2009 | Jiang et al. ..................... 367/140 |
| 2010/0124645 A1 | 5/2010 | Jiang et al. |
| 2010/0133569 A1* | 6/2010 | Li et al. ............................ 257/98 |
| 2010/0221852 A1 | 9/2010 | Li et al. |
| 2012/0175606 A1* | 7/2012 | Wei et al. ......................... 257/43 |

FOREIGN PATENT DOCUMENTS

| CN | 101820036 | 9/2010 |
| TW | 201020209 | 6/2010 |

OTHER PUBLICATIONS

U.S. Appl. No. 13/866,421.*

* cited by examiner

*Primary Examiner* — John C Ingham
(74) *Attorney, Agent, or Firm* — Novak Druce Connolly Bove + Quigg LLP (57) ABSTRACT

A light emitting diode includes a first semiconductor layer, an active layer, a second semiconductor layer, a first electrode, a second electrode. The second electrode includes a treated patterned carbon nanotube film. The treated patterned carbon nanotube film includes at least two carbon nanotube linear units spaced from each other; and carbon nanotube groups spaced from each other. The carbon nanotube groups are located between the at least two carbon nanotube linear units, and combined with the at least two carbon nanotube linear units.

18 Claims, 11 Drawing Sheets

LIGHT EMITTING DIODE

RELATED APPLICATIONS

This application claims all benefits accruing under 35 U.S.C. §119 from China Patent Application No. 201210368199.4, filed on Sep. 28, 2012 in the China Intellectual Property Office, the disclosure of which is incorporated herein by reference. This application is related to a commonly-assigned application entitled, "ORGANIC LIGHT EMITTING DIODE,".

BACKGROUND

1. Technical Field

The present disclosure relates to a light emitting diode.

2. Discussion of Related Art

Semiconductor structures fabricated by gallium nitride for light sources, such as blue, green, and white light sources, have long lifetime, high energy conversion efficiency, and green. Therefore, the semiconductor structures are widely used as the light sources in large screen color display systems, automotive lightening, traffic lights, multimedia displays, optical communication systems, and so on.

A standard light emitting diode (LED) includes an N-type semiconductor layer, a P-type semiconductor layer, an active layer located between the N-type semiconductor layer and the P-type semiconductor layer, a first electrode electrically connected to the N-type semiconductor layer, and a second electrode electrically connected to the P-type semiconductor layer. In an operation, a positive voltage and a negative voltage are applied respectively to the P-type semiconductor layer and the N-type semiconductor layer. Thus, holes in the P-type semiconductor layer and electrons in the N-type semiconductor layer can enter the active layer and combine with each other to emit visible light, and the visible light is emitted from the semiconductor structure. The second electrode should be a transparent material, and is commonly made of indium tin oxide (ITO). However, the ITO has poor mechanical durability, low chemical endurance, and uneven resistance over an entire area. Thus, the LED has a relatively low efficiency and unstable property.

What is needed, therefore, is to provide an LED for solving the problem discussed above.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
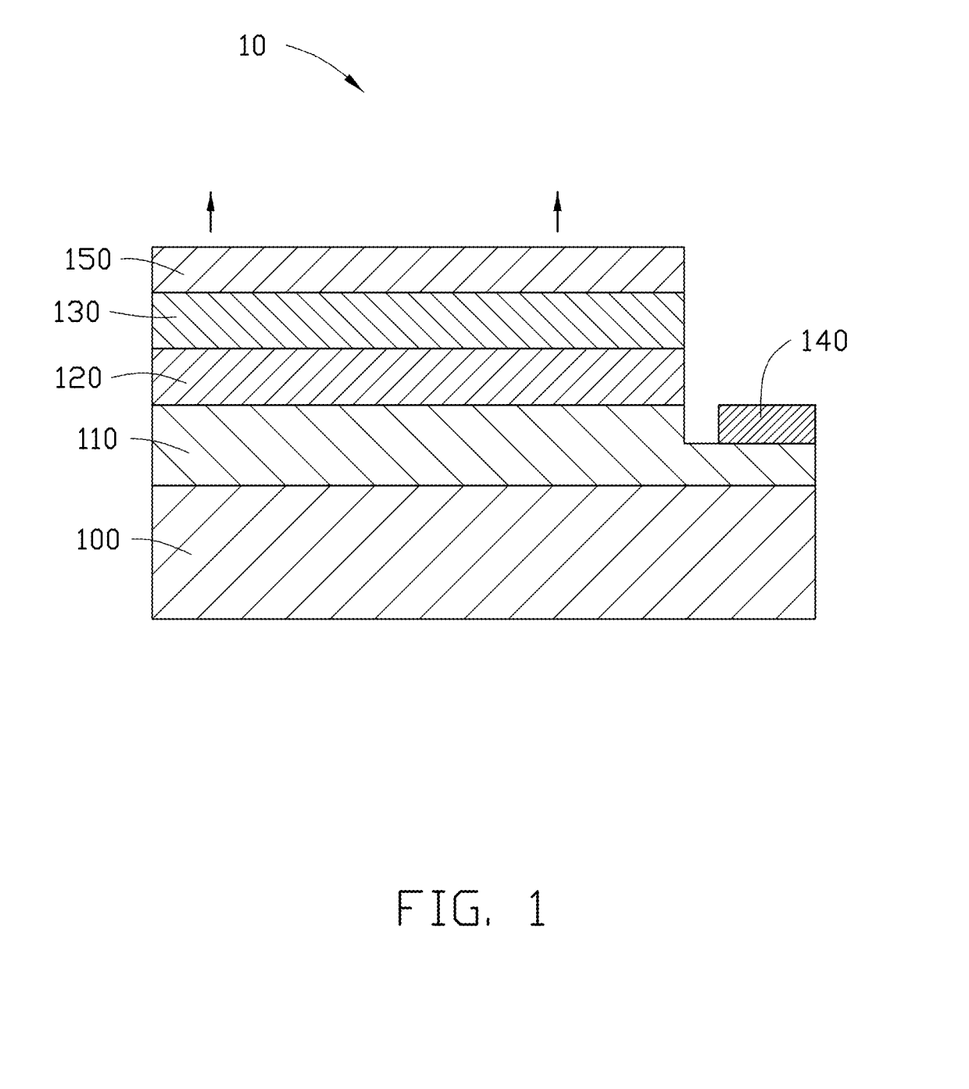
FIG. 1 is a schematic view of one embodiment of an LED.

Referring to FIG. 1, one embodiment of an LED 10 includes a substrate 100, a first semiconductor layer 110, an active layer 120, a second semiconductor layer 130, a first electrode 140, and a second electrode 150. The first semiconductor layer 110, the active layer 120, the second semiconductor layer 130, the first electrode 140, and the second electrode 150 are stacked on the substrate 100. The first semiconductor layer 110 is in contact with the substrate 100. The active layer 120 is sandwiched between the first semiconductor layer 110 and the second semiconductor layer 130. A surface of the second semiconductor layer 130 away from the active layer 120 is a light emitting surface of the LED. The first electrode 140 is electrically connected to the first semiconductor layer 110. The second electrode 150 is electrically connected to the second semiconductor layer 130.

The substrate 100 is adapted to support the first semiconductor layer 110 and has an epitaxial growth surface that is capable of having the first semiconductor layer 110 grown thereon. A size, thickness, and shape of the substrate 100 can be selected according to need. The epitaxial growth surface of the substrate 100 can be a clean and smooth surface. A thickness of the substrate can be in a range from about 300 microns to about 500 microns. A material of the substrate 100 can be silicon on insulator (SOI), $LiGaO_2$, $LiAlO_2$, $Al_2O_3$, Si, GaAs, GaN, GaSb, InN, InP, InAs, InSb, AlP, AlAs, AlSb, AlN, GaP, SiC, SiGe, GaMnAs, GaAlAs, GaInAs, GaAlN, GaInN, AlInN, GaAsP, InGaN, AlGaInN, AlGaInP, GaP:Zn, or GaP:N. The material of the substrate 110 can be selected according to the first semiconductor layer 110 that is to be grown on the substrate 110. The first semiconductor layer 110 and the substrate 100 should have a small crystal lattice mismatch and a thermal expansion mismatch. In one embodiment, the substrate 100 is a sapphire substrate having a thickness of about 400 micron.

The first semiconductor layer 110 can be located on the epitaxial growth surface of the substrate 100. In one embodiment, the first semiconductor layer 110 covers the entire epitaxial growth surface of the substrate 100. The first semiconductor layer 110 and the second semiconductor layer 130 can be respectively an N-type semiconductor and a P-type semiconductor. That is, when the first semiconductor layer 110 is the N-type semiconductor, the second semiconductor layer 130 is the P-type semiconductor. When the first semiconductor layer 110 is the P-type semiconductor, the second semiconductor layer 130 is the N-type semiconductor. A material of the N-type semiconductor can include N-type gallium nitride, N-type gallium arsenide, or N-type copper phosphate. A material of the P-type semiconductor can include P-type gallium nitride, P-type gallium arsenide, or P-type copper phosphate. The N-type semiconductor can be used to provide electrons, and the P-type semiconductor can be configured to provide holes. A thickness of the first semiconductor layer 110 can range from about 1 micron to about 5 microns. In one embodiment, the first semiconductor layer 110 is an N-type gallium nitride semiconductor layer.

In one embodiment, a buffer layer (not shown) can be disposed between and contacting the substrate 100 and the first semiconductor layer 110. The buffer layer is disposed on the epitaxial growth surface of the substrate 100 to improve a quality of growth of the first semiconductor layer 110 via a decrease of the lattice mismatch. A thickness of the buffer layer can be in a range from about 10 nanometers to about 300 nanometers. A material of the buffer layer can be GaN or AlN.

In one embodiment, the first semiconductor layer 110 has a first surface (not labeled) and a second surface (not labeled) opposite to the first surface. The first surface is in contact with the substrate 100. The second surface is not in contact with the substrate 100. The second surface of the first semiconductor layer 110 can be divided into a first region (not labeled) and a second region (not labeled) based on their functions. The first region can be used to have the active layers 120 located thereon. The second region can be used to have the first electrode 140 located thereon.

The active layer 120 can be located on the first region of the first semiconductor layer 110. In one embodiment, the active layer 120 covers the entire surface of the first region. The active layer 120 can be a photon excitation layer. The photon excitation layer can be a single layer quantum well film or multilayer quantum well films. A material of the active layer 120 can be GaN, GaInN, AlGaInN, GaAs, GaAlAs, GaInP, InAsP, and InGaAs. A thickness of the active layer 120 can range from about 0.01 microns to about 0.6 microns. In one embodiment, the active layer 120 has a thickness of about 0.3 microns and includes a layer of GaInN and a layer of GaN stacked with the GaInN layer.

The second semiconductor layer 130 can be located on the surface of the active layer 120 away from the first semiconductor layer 110. In one embodiment, the second semiconductor layer 130 covers the entire surface of the active layer 120. A thickness of the second semiconductor layer 130 can range from about 0.1 micron to about 3 micron. The second semiconductor layer 130 can be an N-type semiconductor layer or a P-type semiconductor layer. Furthermore, the type of the second semiconductor layer 130 is different from the type of the first semiconductor layer 110. In one embodiment, the second semiconductor layer 130 is a P-type gallium nitride doped with Mg and the thickness of the second semiconductor layer 130 is about 0.3 microns.

The surface of the second semiconductor layer 130 away from the active layer 120 can further include a plurality of three dimensional nanostructures to increase the light extraction efficiency of the LED 10.

The first electrode 140 can be electrically connected to the first semiconductor layer 110. In one embodiment, the first electrode 140 is located on the second region of the first semiconductor layer 110 and covers a part of the surface of the second region. The first electrode 140 is spaced apart from the active layer 120. The first electrode 140 can be a single layer structure or a multi-layer structure. A material of the first electrode 140 can be Ti, Ag, Al, Ni, Au, or a combination of thereof. In one embodiment, the first electrode 140 is a two-layer structure including a Ti layer with a thickness of about 15 nanometers and an Au layer with a thickness of about 200 nanometers.

The second electrode 150 can be electrically connected to the second semiconductor layer 130. The second electrode 150 can be located on the surface of the second semiconductor layer 130 away from the active layer 120. In one embodiment, the second electrode 150 covers the entire surface of the second semiconductor layer 130 away from the active layer 120. A material of the second electrode 150 can be a treated patterned carbon nanotube film 30.

Figure 2:
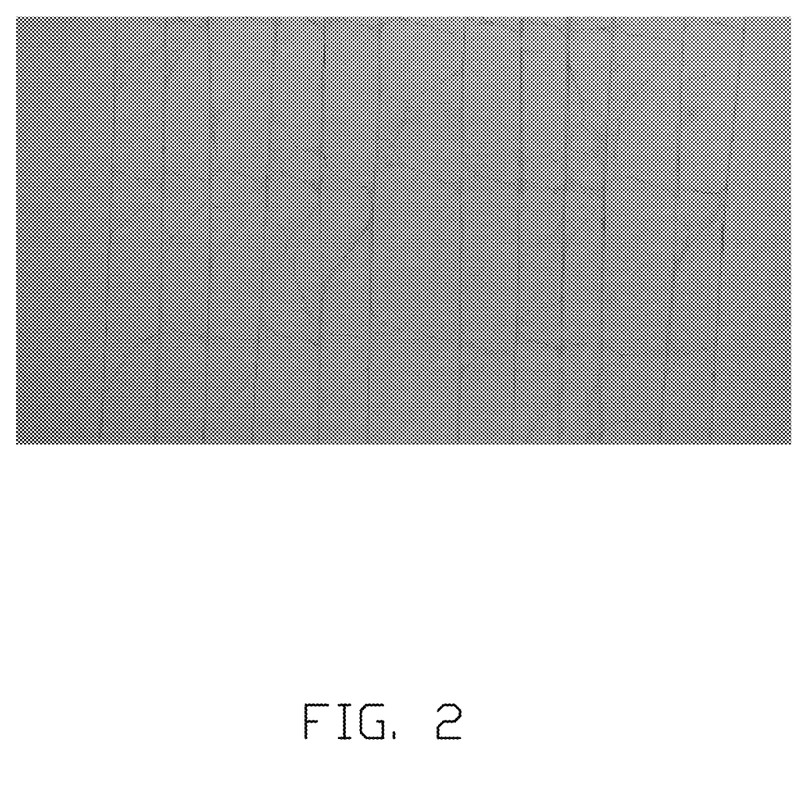
FIG. 2 is an optical microscope image of one embodiment of a second electrode of the LED.
Figure 3:
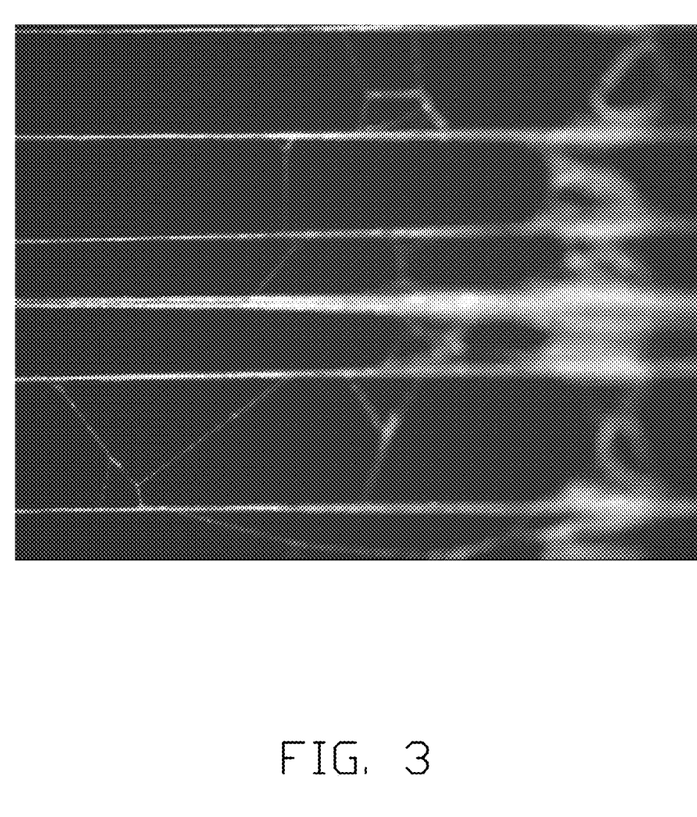
FIG. 3 is an optical microscope image of another embodiment of the second electrode of the LED.

Referring to FIG. 2 and FIG. 3, the treated patterned carbon nanotube film 30 includes a number of carbon nanotube linear units 32 and a number of carbon nanotube groups 34. The carbon nanotube linear units 32 and the carbon nanotube groups 34 are connected together and located in the same plane to cooperatively form the film shape of the treated patterned carbon nanotube film 30. The carbon nanotube linear units 32 are spaced from each other. The carbon nanotube groups 34 join with the carbon nanotube linear units 32 by van der Waals force. The carbon nanotube groups 34 located between adjacent carbon nanotube linear units 32 are separated from each other.

The carbon nanotube linear units 32 substantially extend along a first direction, and are separated from each other along a second direction crossed with the first direction. A shape of an intersection of each carbon nanotube linear unit 32 can be a semi-circle, circle, ellipse, oblate, or other shapes. In one embodiment, the carbon nanotube linear units 32 are substantially parallel to each other, and distances between adjacent carbon nanotube linear units 32 are substantially equal. The carbon nanotube linear units 32 are substantially coplanar. A diameter of each carbon nanotube linear unit 32 is larger than or equal to 0.1 micrometers, and less than or equal to 100 micrometers. In one embodiment, the diameter of each carbon nanotube linear unit 32 is larger than or equal to 5 micrometers, and less than or equal to 50 micrometers. Distances between adjacent carbon nanotube linear units 32 are not limited and can be selected as desired. In one embodiment, the distances between adjacent carbon nanotube linear units 32 are greater than 0.1 millimeters. Diameters of the carbon nanotube linear units 32 can be selected as desired. In one embodiment, the diameters of the carbon nanotube linear units 32 are substantially equal. Each carbon nanotube linear unit 32 includes a number of first carbon nanotubes substantially extending along the first direction. Adjacent first carbon nanotubes extending along the first direction are joined end to end by Van der Waals attractive force. In one embodiment, an axis of each carbon nanotube linear unit 32 is substantially parallel to the axis of first carbon nanotubes in each carbon nanotube linear unit.

The carbon nanotube groups 34 are separated from each other and combined with adjacent carbon nanotube linear units 32 by van der Waals force along the second direction. The treated patterned carbon nanotube film 30 can be a freestanding structure. The "free-standing structure" means that the treated patterned carbon nanotube film 30 can sustain its sheet-shaped structure without any supporter. In one embodiment, the carbon nanotube groups 34 arranged along the second direction are separated from each other by the carbon nanotube linear units 32. The carbon nanotube groups 34 arranged along the second direction also connect with the carbon nanotube linear units 32.

In one embodiment, the carbon nanotube groups 34 can be staggeredly located or disorderly arranged in the second direction. As such, the carbon nanotube groups 34 in the second direction form non-straight conductive paths in the treated patterned carbon nanotube film 30. In one embodiment, the carbon nanotube groups 34 are arranged into columns in the second direction, thus the carbon nanotube groups 34 form consecutive and straight conductive paths along the second direction in the treated patterned carbon nanotube film 30. In one embodiment, the carbon nanotube groups 34 in the treated patterned carbon nanotube film 30 are arranged in an array. A length of each carbon nanotube group 34 in the second direction is substantially equal to the distance between its adjacent carbon nanotube linear units 32, to connect the two carbon nanotube linear units 32 at the two sides of the carbon nanotube group 34. The length of each carbon nanotube group 34 on the second direction is greater than 0.1 millimeters. The carbon nanotube groups 34 are also spaced from each other along the first direction. Spaces between adjacent carbon nanotube groups 34 in the first direction are greater than or equal to 1 millimeter. The first direction can be substantially perpendicular to the second direction.

The carbon nanotube group 34 includes a number of second carbon nanotubes joined together by van der Waals force. Axes of the second carbon nanotubes can be substantially parallel to the first direction or the carbon nanotube linear units 32. The axes of the second carbon nanotubes can also be crossed with the first direction or the carbon nanotube linear units 32. The second carbon nanotubes in each carbon nanotube group 34 can be crossed with each other to form a network structure.

The treated patterned carbon nanotube film 30 includes a number of carbon nanotubes. The carbon nanotubes form the carbon nanotube linear units 32 and carbon nanotube groups 34. In one embodiment, the treated patterned carbon nanotube film 30 consists of the carbon nanotubes. The treated patterned carbon nanotube film 30 defines a number of apertures 22'. Specifically, the apertures 22' are mainly defined by the separate carbon nanotube linear units 32 and the spaced carbon nanotube groups 34. The arrangement of the apertures 22' is similar to the arrangement of the carbon nanotube groups 34. In the treated patterned carbon nanotube film 30, if the carbon nanotube linear units 32 and the carbon nanotube groups 34 are orderly arranged, the apertures 22' are also orderly arranged. In one embodiment, the carbon nanotube linear units 32 and the carbon nanotube groups 34 are substantially arranged as an array, the apertures 22' are also arranged as an array. A ratio of an area sum of the carbon nanotube linear units 32 and the carbon nanotube groups 34 to an area of the apertures 22' is less than or equal to 1:19. In other words, in treated patterned the carbon nanotube film 30, a ratio of the area having the carbon nanotubes to the area of the apertures 22' is less than or equal to 1:19. In one embodiment, in the treated patterned carbon nanotube film 30, the ratio of the total sum area of the carbon nanotube linear units 32 and the carbon nanotube groups 34 to the area of the apertures 22' is less than or equal to 1:49. Therefore, a transparency of the treated patterned carbon nanotube film 30 is greater than or equal to 95%. In one embodiment, the transparency of the treated patterned carbon nanotube film 30 is greater than or equal to 98%.

The treated patterned carbon nanotube film 30 is an anisotropic conductive film. The carbon nanotube linear units 32 form first conductive paths along the first direction in the treated patterned carbon nanotube film 30, as the carbon nanotube linear units 32 extend along the first direction. The carbon nanotube groups 34 form second conductive paths along the second direction in the treated patterned carbon nanotube film 30. Therefore, a resistance of the treated patterned carbon nanotube film 30 along the first direction is different from a resistance of the treated patterned carbon nanotube film 30 along the second direction. The resistance of the treated patterned carbon nanotube film 30 along the second direction is over 10 times greater than the resistance of the treated patterned carbon nanotube film 30 along the first direction. In one embodiment, the resistance of the treated patterned carbon nanotube film 30 along the second direction is over 20 times greater than the resistance of the treated patterned carbon nanotube film 30 along the first direction. In one embodiment, the resistance of the treated patterned carbon nanotube film 30 along the second direction is about 50 times greater than the resistance of the treated patterned carbon nanotube film 30 along the first direction. In the treated patterned carbon nanotube film 30, the carbon nanotube linear units 32 are joined by the carbon nanotube groups 34 on the second direction, which makes the treated patterned carbon nanotube film 30 strong and stable.

It is noted that there can be a few carbon nanotubes randomly surrounding the carbon nanotube linear units 32 and the carbon nanotube groups 34 in the treated patterned carbon nanotube film 30. However, these few carbon nanotubes have a small and negligible effect on the properties of the treated patterned carbon nanotube film 30.

Figure 4:
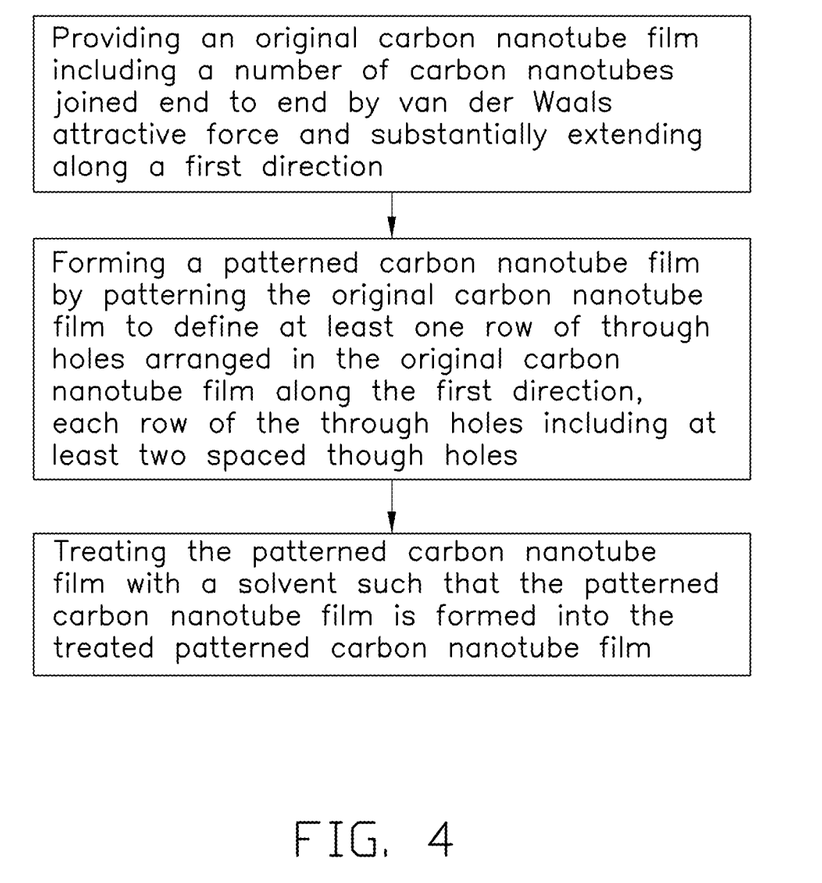
FIG. 4 is a flowchart of one embodiment of a method for making the second electrode of the LED.

Referring to FIG. 4, one embodiment of a method for making the treated patterned carbon nanotube film 30 includes the following steps:

S10, providing an original carbon nanotube film including a number of carbon nanotubes joined end to end by van der Waals attractive force and substantially extending along a first direction;

S20, forming a patterned carbon nanotube film 20 by patterning the original carbon nanotube film to define at least one row of through holes arranged in the original carbon nanotube film along the first direction, each row of the through holes including at least two spaced though holes 22; and S30, treating the patterned carbon nanotube film 20 with a solvent such that the patterned carbon nanotube film 20 is formed into the treated patterned carbon nanotube film 30.

Figure 5:
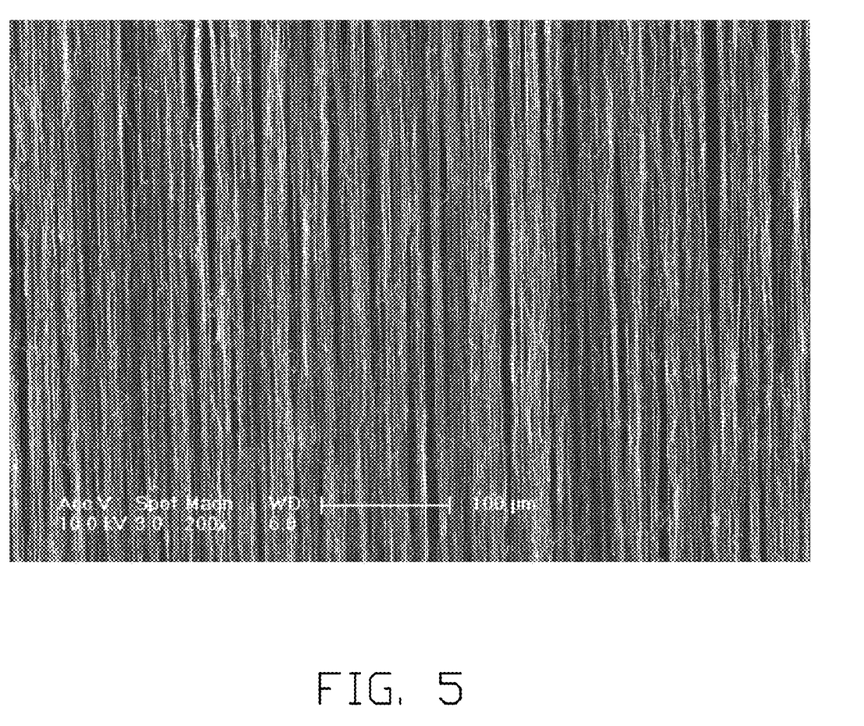
FIG. 5 is a scanning electron microscope (SEM) image of an original carbon nanotube film.

Referring to FIG. 5, in step S10, the original carbon nanotube film includes a plurality of carbon nanotubes substantially aligned along a first direction. The original carbon nanotube film can be obtained by drawing from a carbon nanotube array. Specifically, the original carbon nanotube film can be made by the steps of: providing the carbon nanotube array including a number of substantially parallel carbon nanotubes; and selecting carbon nanotubes from the carbon nanotube array and pulling the selected carbon nanotubes substantially along the first direction, thereby forming the original carbon nanotube film.

In one embodiment, the carbon nanotube array is formed on a substrate, and the carbon nanotubes in the carbon nanotube array are substantially perpendicular to the substrate. During the pulling process, as the initial carbon nanotubes are drawn out and separated from the substrate, other carbon nanotubes are also drawn out end to end due to van der Waals force between ends of adjacent carbon nanotubes. This process of pulling produces the original carbon nanotube film with a certain width. The extending direction of the carbon nanotubes in the original carbon nanotube film is substantially parallel to the pulling direction of the original carbon nanotube film. Therefore, the original carbon nanotube film consists of carbon nanotubes, and the carbon nanotubes are combined by van der Waals force. The original carbon nanotube film is a free-standing structure. The carbon nanotubes in the original carbon nanotube film define a number of micropores, and effective diameters of the micropores are less than 100 nanometers.

The step S20 is mainly used to form spaced through holes 22 arranged along the first direction in the original carbon nanotube film. The original carbon nanotube film can be patterned by using laser beams or electron beams irradiate the original carbon nanotube film.

In one embodiment, the original carbon nanotube film is patterned by laser beams, and the step S20 includes the following sub-steps. A laser is provided. An irradiating path of a laser beam emitted from the laser can be controlled by a computer. A shape data of the original carbon nanotube film having the though holes 22 are inputted into the computer, which controls the irradiating path of the laser beam. The laser irradiates the original carbon nanotube film to form the through holes 22. A power density of the laser beam ranges from about 10000 watts per square meter to about 100000 watts per square meter and a moving speed of the laser beam ranges from about 800 millimeters per second (mm/s) to about 1500 mm/s. In one embodiment, the power density is in a range from about 70000 watts per square meter to about 80000 watts per square meter, and the moving speed is in a range from about 1000 mm/s to about 1200 mm/s In step S20, a shape of each through hole 22 can be a circle, ellipse, triangle, polygon, quadrangle, or other shapes. The quadrangle shape can have at least one pair of parallel sides, such as a parallelogram, trapezia, rectangle, square, or rhombus. In one embodiment, the shape of each through hole 22 is rectangular. In another embodiment, the shape of the through hole 22 is a straight line, which can be considered as a rectangle with a narrow width. A size of the through hole 22 and micropore represents the maximum distance between one point to another point both on the edge of the through hole 22 and micropore. An effective size of the through hole 22 is larger than the effective size of the micropore in the original carbon nanotube film. In one embodiment, the effective size of the through hole 22 is larger than or equal to 0.1 millimeters. A space between adjacent through holes 22 is larger than the effective size of the micropore in the original carbon nanotube film. In one embodiment, the space between adjacent through holes 22 is larger than or equal to 0.1 millimeters. The shape and effective size of the through hole 22 and the space between adjacent through holes 22 can be selected as desired. In one embodiment, the shape of the through hole 22 is square having edges larger than or equal to 0.1 millimeters, and the distance between the adjacent through holes 22 is larger than or equal to 0.1 millimeters.

Figure 6:
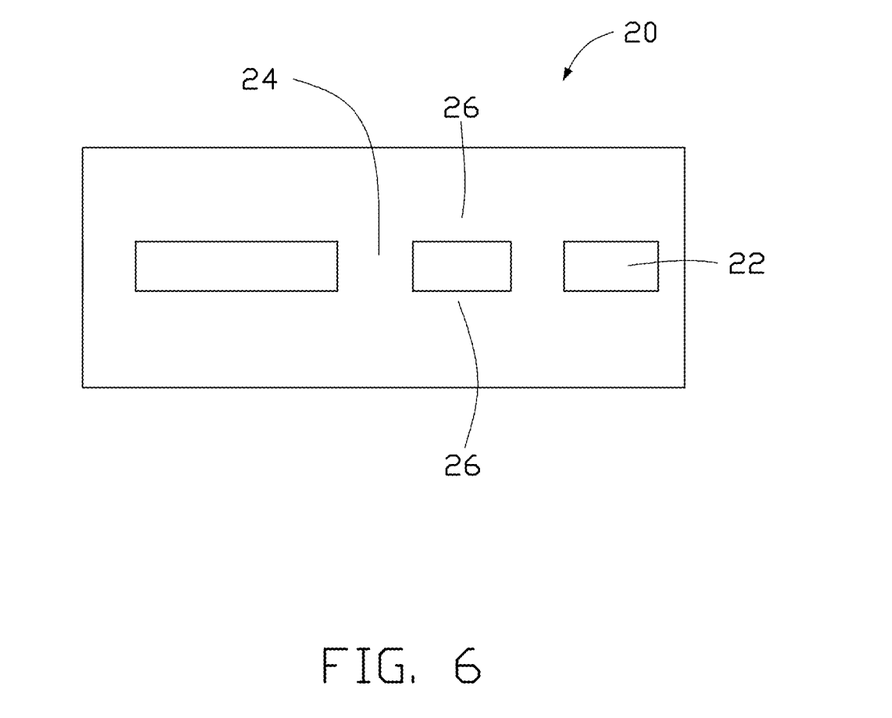
FIG. 6 is a schematic view of one embodiment of a patterned carbon nanotube film with through holes substantially arranged in a row.

In step S20, the patterned carbon nanotube film 20 can be divided into a number of connecting parts 24 and at least two extending parts 26 by the through holes 22. The connecting parts 24 are located between adjacent through holes 22 in each row. The connecting parts 24 are separated from each other along the first direction by the through holes 22. The at least two extending parts 26 substantially extend along the first direction. The at least two extending parts 26 are connected with each other on the second direction by the connecting parts 24. Therefore, the at least two extending parts 26 and the connecting parts 24 are an integrated structure. Specifically, structures of the patterned carbon nanotube film 20 can be described as follow:

(1) Referring to FIG. 6, a number of through holes 22 are separately formed in a patterned carbon nanotube film 20. The through holes 22 are arranged into only one row along a first direction X. The first direction X is substantially parallel to the extending direction of the carbon nanotubes in the patterned carbon nanotube film 20. The patterned carbon nanotube film 20 can be divided into a number of connecting parts 24 and two extending parts 26 by the through holes 22. The connecting parts 24 are parts of the patterned carbon nanotube film 20 between adjacent through holes 22 in the same row. The two extending parts 26 are parts of the patterned carbon nanotube film 20 except the connecting parts 24.

The connecting parts 24 are separated from each other by the though holes 22. The connecting parts 24 and the though holes 22 in the same row are alternately arranged. The two extending parts 26 are located on opposite sides of the connecting parts 24. The extending parts 26 are divided by the connecting parts 24 along a second direction Y crossed with the first direction X. In one embodiment, the second direction Y is substantially perpendicular to the first direction X. Each extending part 26 extends along the first direction X.

Figure 7:
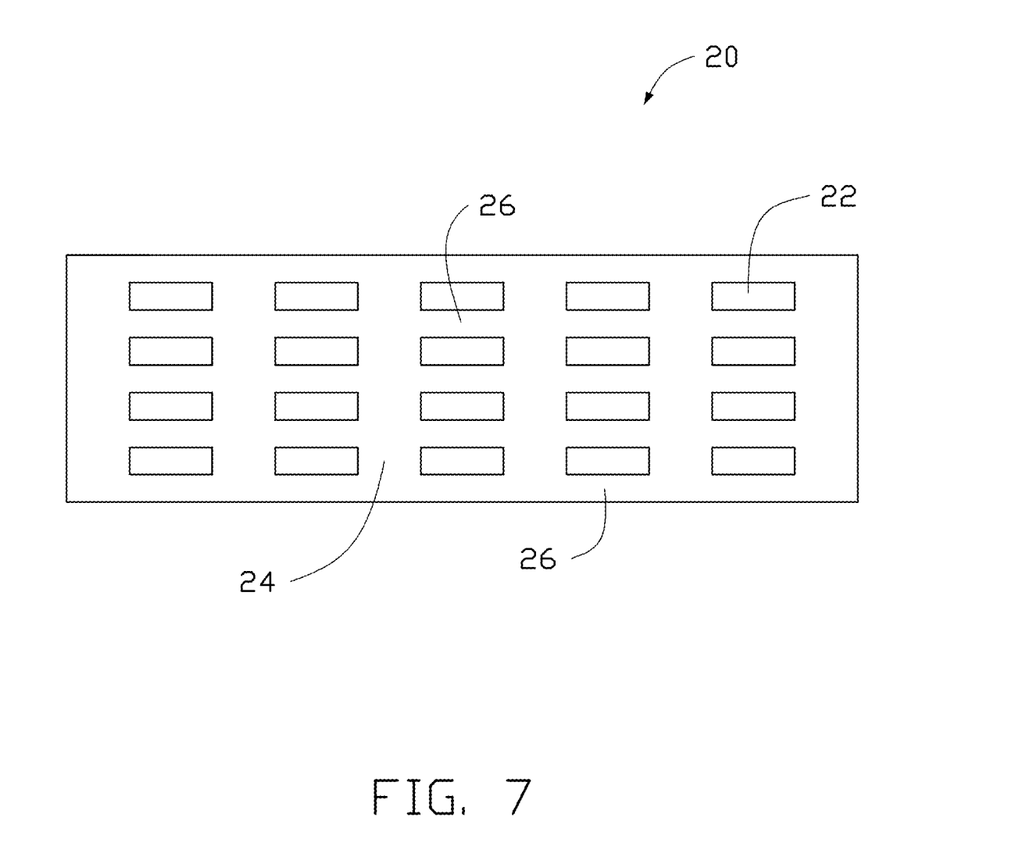
FIG. 7 is a schematic view of another embodiment of the patterned carbon nanotube film with through holes substantially arranged in a number of rows.
Figure 8:
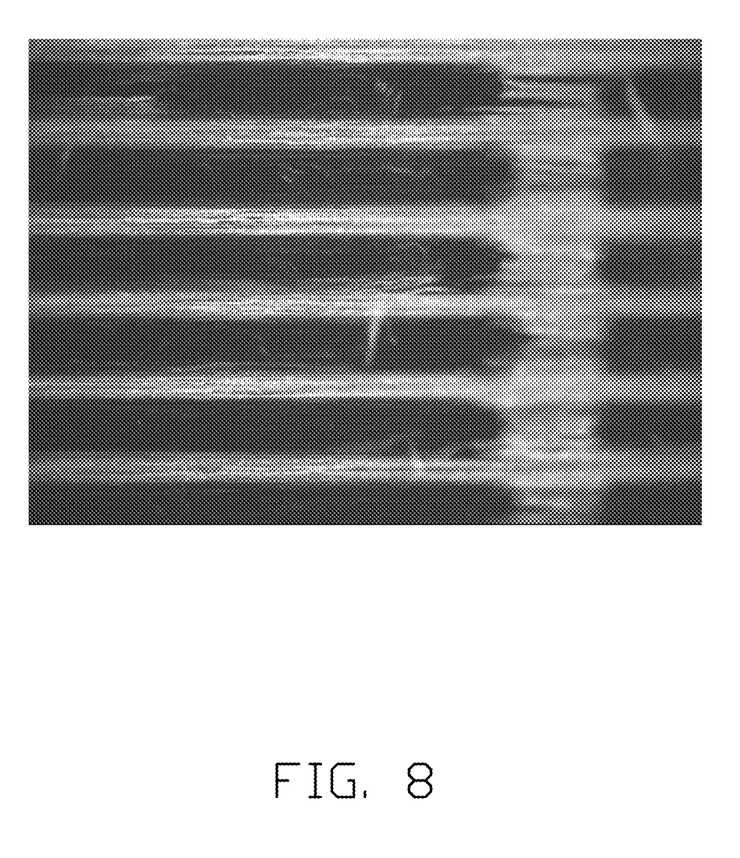
FIG. 8 is an optical microscope image of the patterned carbon nanotube film including through holes.

(2) Referring to FIG. 7 and FIG. 8, a number of through holes 22 are arranged into a number of rows in the patterned carbon nanotube film 20. The through holes 22 in the same row are spaced from each other along the first direction X. The through holes 22 in the second direction Y are arranged in columns, and the through holes 22 in the same column are spaced from each other. The through holes 22 can be arranged as an array. It can be understood that, in another embodiment, the through holes 22 can also be staggered with each other along the second direction Y. That is, the through holes 22 in the second direction Y are not arranged in a straight line.

The patterned carbon nanotube film 20 is divided into a number of connecting parts 24 and a number of extending parts 26 by the through holes 22. Every adjacent connecting parts 24 in the same row are separated by the through hole 22. A length of each connecting part 24 is equal to a space between adjacent through holes 22 in the same row along the first direction X. Each extending part 26 is a connective structure along the first direction X. Each extending part 26 is sandwiched between adjacent connecting parts 24 in the second direction Y. A width of each extending part 26 in the second direction Y is equal to a space between adjacent through holes 22 in the second direction Y. The extending parts 26 connect with adjacent connecting parts 24 arranged along the second direction Y. In one embodiment, an effective length of each through hole 22 in the first direction X is larger than a space between adjacent through holes 22 along the second direction Y. The extending parts 26 and the connecting parts 24 are belonged to the integrated structure of the patterned carbon nanotube film 20.

The shapes of the through holes 22 or the space between adjacent through holes 22 arranged in the same row or in the same column can be different. In the patterned carbon nanotube film 20, the arrangement of the connecting parts 24 is similar to the arrangement of the through holes 22. There are a few carbon nanotubes protruding around edges of each through holes 22, which is a result of the manufacturing process of the treated patterned carbon nanotube film 30.

In step S30, the patterned carbon nanotube film 20 is suspended. Referring to FIGS. 2, 3, 8, and 9, the step S30 can include dropping or spraying the solvent on the suspended patterned carbon nanotube film 20, and further shrinking the patterned carbon nanotube film 20 into the treated patterned carbon nanotube film 30. Because the carbon nanotubes in each extending part of the original carbon nanotube film are substantially joined end-to-end and substantially oriented along the first direction, and each extending part 26 of the original carbon nanotube film is a consecutive structure on the first direction, the extending parts 26 in the original carbon nanotube film are shrunk into the carbon nanotube linear units 22 of the treated patterned carbon nanotube film 30 under interfacial tension of the solvent as it dissipates (e.g., volatilizes). During the treating process with the solvent, each extending part 26 of the patterned carbon nanotube film 20 is substantially shrunk toward its center in the second direction and formed into the carbon nanotube linear unit 32, a space between adjacent extending parts 26 will be increased. Therefore, the carbon nanotube linear units 32 are spaced from each other in the treated patterned carbon nanotube film 30. A space between adjacent carbon nanotube linear units 32 in the treated patterned carbon nanotube film 30 is larger than the effective diameter of the through holes 22 connected with the extending part 26 or larger than the effective diameter of the through holes 22 defined in the patterned carbon nanotube film 20 in the second direction (e.g., larger than 0.1 millimeters). Simultaneously, each connecting part 24 will be pulled along the second direction due to the shrinking of the adjacent extending parts 26. The orientation of the carbon nanotubes in the connecting part may be varied due to the pulling. The connecting part 24 is formed into the carbon nanotube group 34 in the treated patterned carbon nanotube film 30. Therefore, the treated patterned carbon nanotube film 30 is formed.

An interfacial tension is generated between the patterned carbon nanotube film 20 and the solvent, and the interfacial tension varies depending on the volatility of the solvent. Pulling forces applied to the connecting parts 24 are produced by the shrinking of the extending parts 26. The pulling forces vary depending on the interfacial tension. Different solvent may have different pulling forces to the carbon nanotubes in the patterned carbon nanotube film 20. The pulling forces can affect the arrangement of the carbon nanotubes in the connecting parts 24, and further affect the structures of the carbon nanotube groups 34 in the treated patterned carbon nanotube film 30. Different solvent may result different arrangement of the carbon nanotubes in the carbon nanotube groups 34.

Figure 9:
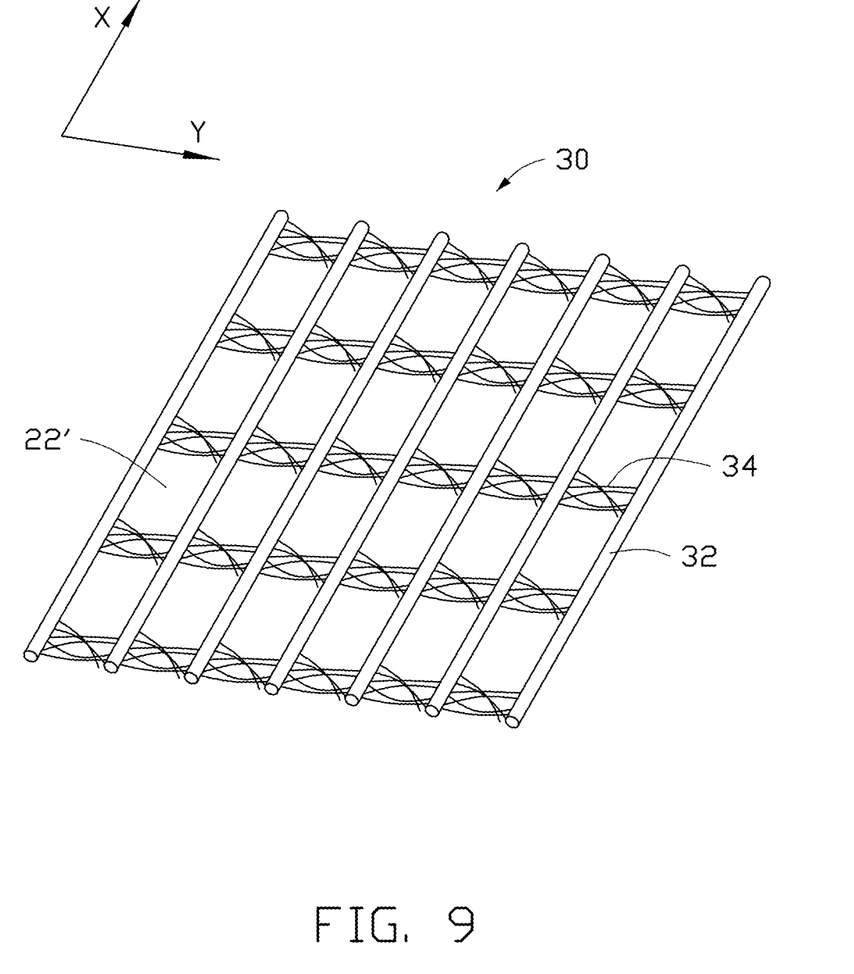
FIG. 9 is a schematic view of one embodiment of the second electrode of the LED.

Referring to FIG. 2 and FIG. 9, if the solvent is an organic solvent with a high volatility, such as alcohol, methanol, acetone, dichloroethane, or chloroform, the interfacial tension generated between the patterned carbon nanotube film 20 and the solvent is strong. During the process of shrinking the extending parts, pulling forces are produced. The pulling forces applied to the connecting parts 24 adjacent to the extending parts 26 are strong. The carbon nanotubes oriented along the first direction in the connecting parts 24 will be formed into the second carbon nanotubes extending along a direction crossing with the first direction. Simultaneously, under the interfacial tension, the carbon nanotubes in each connecting part 24 will be shrunk and each connecting part 24 will be formed into the carbon nanotube group 34 with a net structure.

In one embodiment, a first angle defined by the second carbon nanotubes and the first direction is greater than or equal to 45 degrees, and less than or equal to 90 degrees.

In one embodiment, light transmittances of sample 1 (original carbon nanotube film), sample 2 (patterned carbon nanotube film 20), and sample 3 (treated patterned carbon nanotube film 30) are tested. In this embodiment, the patterned carbon nanotube film 20 has a plurality of through holes 22 having the rectangle shape formed by the laser beam. The through holes 22 are arranged in an array. Each through hole 22 has a length of about 3 millimeters and a width of about 1 millimeter. A distance between adjacent through holes 22 along the length direction of the through holes 22 is about 1 millimeter. A distance between adjacent through holes 22 along the width direction of the through holes 22 is about 1 millimeter. The light transmittances are tested when the samples 1-3 are suspended in air. The results are shown in Table 1.

TABLE 1

| sample | transmittances to different wavelengths of light/% | | | | | | | |
|---|---|---|---|---|---|---|---|---|
| | 370 nm | 450 nm | 500 nm | 550 nm | 600 nm | 650 nm | 700 nm | 750 nm |
| 1 | 76.08 | 79.17 | 80.31 | 81.2 | 81.88 | 82.46 | 82.92 | 83.32 |
| 2 | 80.39 | 83.03 | 84.01 | 84.73 | 85.27 | 85.78 | 86.14 | 86.51 |
| 3 | 98.43 | 98.42 | 84.01 | 98.43 | 98.40 | 98.45 | 98.42 | 98.38 |

Figure 10:
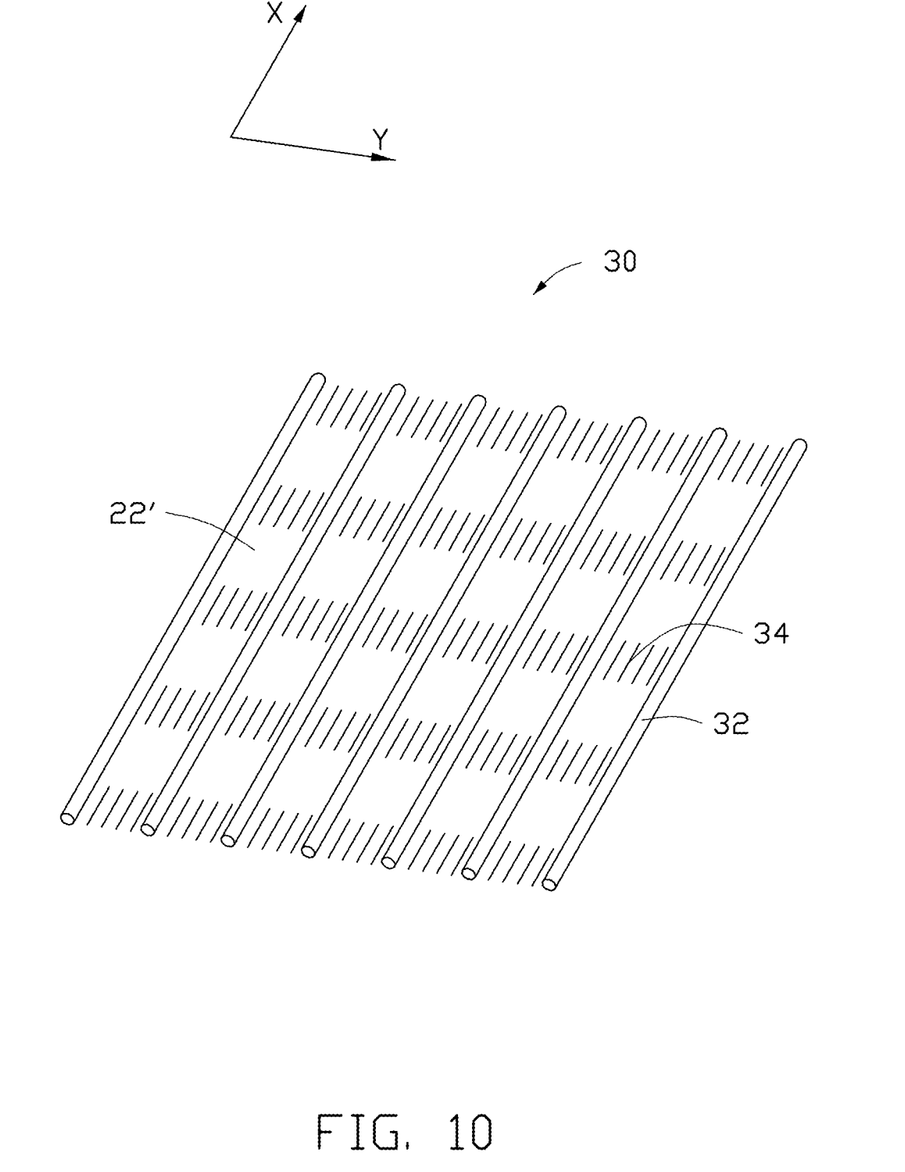
FIG. 10 is a schematic view of another embodiment of the second electrode of the LED.

Referring to FIG. 3 and FIG. 10, if the solvent has a low wetting to carbon nanotube, such as water in a mixture of water and an organic solvent, the interfacial force between the patterned carbon nanotube film 20 and the solvent is relatively weak. The pulling forces generated by the shrinking of the extending parts 26 are weak, thus the pulling forces are weakly applied to the connecting parts 24. The arrangements of the carbon nanotubes in the connecting parts 24 will be a little changed by the weak pulling forces. A second angle is defined by the second carbon nanotubes in the carbon nanotube groups 34 with the first direction. The second angle is less than or equal to 30 degrees. In one embodiment, the second angle is less than or equal to 15 degrees. In one embodiment, the first solvent is water, and during the process of forming the carbon nanotube linear units 32, the arrangements of carbon nanotubes in the connecting parts 24 are substantially not changed. Therefore, the second carbon nanotubes in the carbon nanotube groups 34 are substantially parallel to the carbon nanotube linear units 32 and the first direction.

In the step S20, if the through holes 22 are arranged in rows, the carbon nanotube linear units 32 made from the extending parts 26 of the original carbon nanotube film, will be substantially parallel to each other. If the through holes 22 are arranged in rows and columns, the extending parts 26 will be formed into carbon nanotube linear units 32 substantially extending along the first direction, and the carbon nanotube linear units 32 are separately arranged on the second direction. At the same time, the connecting parts 24 will be formed into the carbon nanotube groups 34, and the carbon nanotube groups 34 will connect with the carbon nanotube linear units 32 on the second direction and be spaced in the first direction. The carbon nanotube linear units 32, which are substantially parallel and separate on the second direction, form the first conductive paths substantially extending along the first direction. The carbon nanotube groups 34 are connected with the carbon nanotube linear units 32 in the second directions and spaced in the first direction, which form the second conductive paths extending along the second direction.

Therefore, the diameters of the carbon nanotube linear units 32 can be selected by the spaces between adjacent through holes 22 in the second direction and the shapes of the through holes 22. Spaces between adjacent carbon nanotube linear units 32 can be controlled by the spaces between adjacent through holes 22 in the second direction and the widths of through holes 22 in the second direction. In one embodiment, the shape of the through holes 22 is rectangular, the widths of the through holes in the second direction are equal, and the spaces between adjacent though holes 22 in the same rows are equal. Therefore, the shapes and the diameters of the carbon nanotube linear units 32 are respectively equal. Further, if the lengths of the through holes 22 in the first directions are equal, the carbon nanotube groups 34 will be substantially arranged in the second direction and the shapes of the carbon nanotube groups 34 will be substantially the same. In conclusion, both the spaces between adjacent carbon nanotube linear units 32 and the diameter of the carbon nanotube linear units 32 can be effectively and easily adjusted according to the method for making the treated patterned carbon nanotube film 30 provided by the present disclosure.

Under the same condition, a resistance of the treated patterned carbon nanotube film 30 along the first direction is not affected by the number of the through holes 22 arranged along the first direction. The more through holes 22 that are arranged along the first direction, the higher a resistance of the treated patterned carbon nanotube film 30 along the second direction. The less through holes 22 that are arranged along the first direction, the lower the resistance of the treated patterned carbon nanotube film 30 along the second direction. Under the same condition, the resistance of the treated patterned carbon nanotube film 30 along the second direction is not affected by the number of the through holes 22 in the patterned carbon nanotube film 20 along the second direction. The more through holes 22 that are arranged along the second direction, the higher a resistance of the treated patterned carbon nanotube film 30 along the first direction. The fewer through holes 22 that are arranged along the second direction, the lower the resistance of the treated patterned carbon nanotube film 30 along the first direction. Therefore, the resistance of the treated patterned carbon nanotube film 30, especially the electrical anisotropy of the treated patterned carbon nanotube film 30, can be changed by the number of the through holes 22 in the patterned carbon nanotube film 20. That is, the step S20 can affect the resistance of the treated patterned carbon nanotube film 30.

It is noted that, the electrical conductivity of the treated patterned carbon nanotube film 30 can be affected by parameters of the through holes 22. If the through holes 22 are uniformly distributed in the patterned carbon nanotube film 20 and each through hole 22 is rectangular, the length of each through hole 22 in the first direction is marked as parameter A, the width of each through hole 22 in the second direction is marked as parameter B, the space between adjacent through holes 22 in the first direction is marked as parameter C, and the space between adjacent through holes 22 in the second direction is marked as parameter D. In one embodiment, the parameter A is smaller than the parameter D. If compared with the parameter A, the parameter B is relatively small, the through holes 22 can be considered as straight lines. The affect of the parameters of the through holes 22 on the resistance and electrical anisotropy of the treated patterned carbon nanotube film 30 can be detailed below:

(1) If the parameters A and B are constant, the ratio of the resistance of the treated patterned carbon nanotube film 30 along the second direction to the resistance of the treated patterned carbon nanotube film 30 along the first direction is increased as the ratio of the parameter A to parameter B (A/B) increases. The electrical anisotropy of the treated patterned carbon nanotube film 30 is proportional to the ratio of the parameter A to parameter B.

(2) If the parameters A and C are constant, the resistance of the treated patterned carbon nanotube film 30 at the first direction is increased as the ratio of the parameter B to parameter D (B/D) increases.

(3) If the parameters B and D are constant, the resistance of the treated patterned carbon nanotube film 30 along the second direction is increased as the ratio of the parameter A to parameter C (A/C) increases. In addition, the electrical anisotropy of the treated patterned carbon nanotube film 30 can be improved by decreasing the ratio of the parameter A to the parameter C.

In the step S20, the original carbon nanotube film can be suspended during the treating by the laser beam and the solvent. The two ends of the original carbon nanotube film can be fixed to keep the width of the original carbon nanotube film unchanged. The method for making the treated patterned carbon nanotube film 30 can further include a step of collecting the treated patterned carbon nanotube film 30. Specifically, one end of the original carbon nanotube film drawn from the carbon nanotube array can be fixed on a collecting unit. The collecting unit can be rotated, the original carbon nanotube film can be continuously patterned by the laser beam and treated with the solvent in order, and then the treated patterned carbon nanotube film 30 is continuously formed and collected on the collecting unit.

Furthermore, a reflector layer (not shown) can be located on a surface of substrate 100 away from the first semiconductor layer 110. A material of the reflector layer can be titanium, silver, aluminum, nickel, gold or a combination thereof. The reflector layer includes a smooth surface having a high reflectivity. The photons that reached the reflector layer can be reflected by the reflector layer, thus, these photons can be extracted out of the LED 10 to improve the light extraction efficiency of the LED 10.

Figure 11:
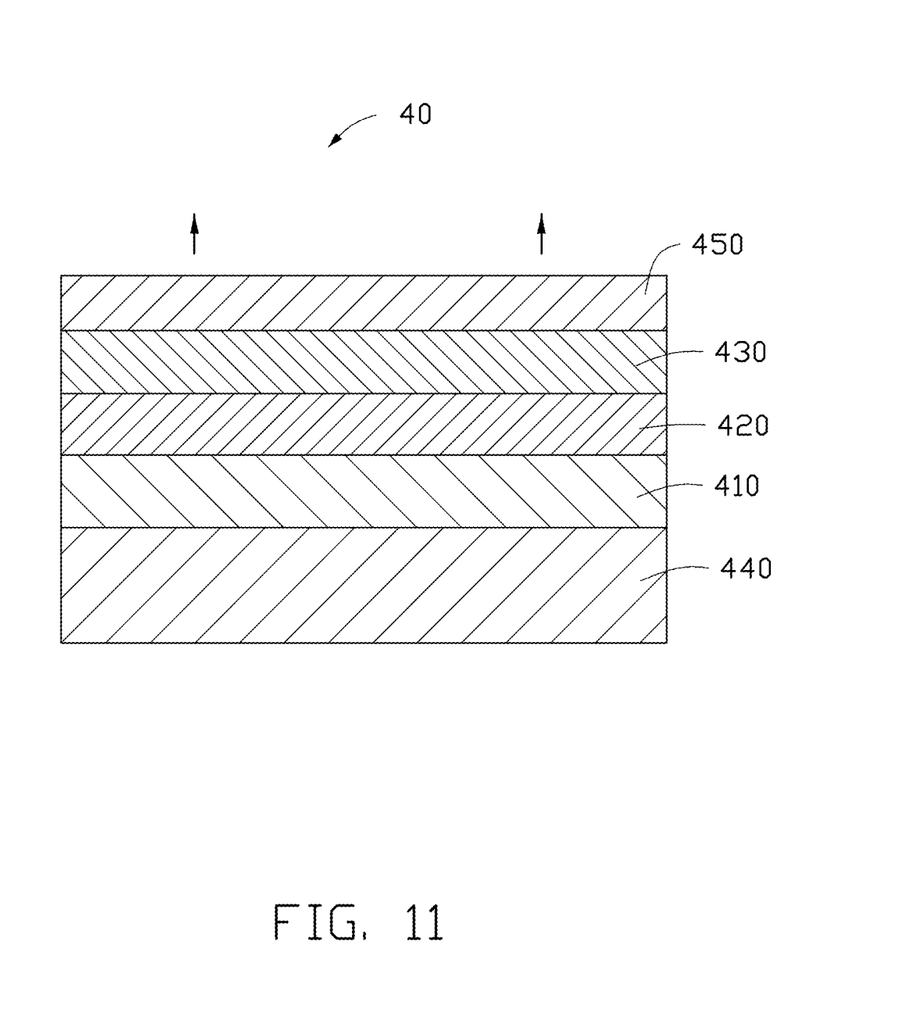
FIG. 11 is a schematic view of another embodiment of the LED.

Referring to FIG. 11, another embodiment of an LED 40 is provided. The LED 40 includes a first semiconductor layer 410, an active layer 420, a second semiconductor layer 430, a first electrode 440, and a second electrode 450. The first semiconductor layer 410, the active layer 420, the second semiconductor layer 430, and the second electrode 450 are stacked on the first electrode 440. The first semiconductor layer 410 is in contact with the first electrode 440. The second electrode 450 is in contact with the second semiconductor layer 430. The active layer 420 is sandwiched between the first semiconductor layer 410 and the second semiconductor layer 430. A surface of the second semiconductor layer 430 away from the active layer 420 is a light emitting surface of the LED. The first electrode 440 is electrically connected to the first semiconductor layer 410. The second electrode 450 is electrically connected to the second semiconductor layer 430.

Further, the reflector layer (not shown) can be disposed on the surface of the first electrode 440 away from the first semiconductor layer 410.

The treated patterned carbon nanotube film has a high conductivity, and is used as the electrode of the LED to increase the working current of the LED and decrease the current loss. The light transmittance of the treated patterned carbon nanotube film is high (e.g., about 95%), thus, the LED can have a good transparency and a high light extraction efficiency. In the treated patterned carbon nanotube film, each of the carbon nanotube linear units and the carbon nanotube groups are formed from a plurality of carbon nanotubes closely combined with each other by van der Waals attractive force, which makes the treated patterned carbon nanotube film has a better mechanical property than the original carbon nanotube film and the patterned carbon nanotube film. The mechanical durability of the LED can be improved.

It is to be understood that the above-described embodiment is intended to illustrate rather than limit the disclosure. Variations may be made to the embodiment without departing from the spirit of the disclosure as claimed. The above-described embodiments are intended to illustrate the scope of the disclosure and not restricted to the scope of the disclosure.

It is also to be understood that the above description and the claims drawn to a method may include some indication in reference to certain steps. However, the indication used is only to be viewed for identification purposes and not as a suggestion as to an order for the steps.

What is claimed is:

1. A light emitting diode comprising:
a first semiconductor layer;
an active layer;
a second semiconductor layer;
a first electrode electrically connected with the first semiconductor layer;
a second electrode electrically connected with the second semiconductor layer,
wherein the active layer is located between the first semiconductor layer and the second semiconductor layer, the second semiconductor layer comprises a light emitting surface, the second electrode is located on the light emitting surface and comprises a treated patterned carbon nanotube film, and the treated patterned carbon nanotube film comprises:
at least two carbon nanotube linear units spaced from each other, and a distance between the at least two carbon nanotube linear units is larger than 0.1 millimeters; and
a plurality of carbon nanotube groups spaced from each other, located between the at least two carbon nanotube linear units, and combined with the at least two carbon nanotube linear units.

2. The light emitting diode of claim 1, wherein the at least two carbon nanotube linear units are substantially parallel to each other and are aligned along a first direction to form first conductive paths.

3. The light emitting diode of claim 2, wherein the plurality of carbon nanotube groups are spaced from each other in the first direction and are combined with the at least two carbon nanotube linear units in a second direction, that intersects with the first direction, to form second conductive paths; and the first conductive paths intersect with the second conductive paths.

4. The light emitting diode of claim 3, wherein the at least two carbon nanotube linear units comprise a plurality of carbon nanotube linear units, the plurality of carbon nanotube groups are located between each of two adjacent carbon nanotube linear units and are arranged in a staggered manner in the second direction.

5. The light emitting diode of claim 3, wherein the at least two carbon nanotube linear units comprise a plurality of carbon nanotube linear units, the plurality of carbon nanotube groups are located between each of two adjacent carbon nanotube linear units and are arranged in columns in the second direction.

6. The light emitting diode of claim 1, wherein each carbon nanotube linear unit comprises a plurality of carbon nanotubes joined end-to-end by van der Waals force and substantially oriented along an axis direction of the each carbon nanotube linear unit.

7. The light emitting diode of claim 1, wherein a diameter of each carbon nanotube linear unit is greater than or equal to 0.1 micrometers, and less than or equal to 100 micrometers.

8. The light emitting diode of claim 1, wherein each carbon nanotube group comprises a plurality of carbon nanotubes substantially extending along an axis direction of the at least two carbon nanotube linear units.

9. The light emitting diode of claim 1, wherein each carbon nanotube group comprises a plurality of carbon nanotubes that intersect an axis direction of the at least two carbon nanotube linear units.

10. The light emitting diode of claim 1, wherein a distance between adjacent carbon nanotube groups located between the at least two carbon nanotube linear units is larger than 1 millimeter.

11. The light emitting diode of claim 1 further comprising a substrate, wherein the first semiconductor layer comprises a surface, the substrate is located on the surface of the first semiconductor layer.

12. A light emitting diode comprising:
a first semiconductor layer;
an active layer;
a second semiconductor layer;
a first electrode electrically connected with the first semiconductor layer;
a second electrode electrically connected with the second semiconductor layer,
wherein the first semiconductor layer and the second semiconductor layer sandwich the active layer therebetween, the second semiconductor layer comprises a light emitting surface, the second electrode is located on the light emitting surface and comprises a treated patterned carbon nanotube film, the treated patterned carbon nanotube film comprises:
a plurality of carbon nanotube linear units spaced from each other; and
a plurality of carbon nanotube groups spaced from each other and combined with the plurality of carbon nanotube linear units,
wherein the plurality of carbon nanotube linear units and the plurality of carbon nanotube groups cooperatively define a plurality of apertures, a ratio of a total area of the plurality of carbon nanotube linear units and the plurality of carbon nanotube groups to a total area of the plurality of apertures is less than or equal to 1:19.

13. The light emitting diode of claim 12, wherein the ratio is less than or equal to 1:49.

14. The light emitting diode of claim 12, wherein the plurality of carbon nanotube linear units are substantially parallel to each other and are aligned along a first direction.

15. The light emitting diode of claim 14, wherein the plurality of carbon nanotube groups are spaced from each other in the first direction and are combined with the at least two carbon nanotube linear units in a second direction, the first direction is perpendicular to the second direction.

16. The light emitting diode of claim 14, wherein each carbon nanotube group comprises a plurality of carbon nanotubes substantially extending along the first direction.

17. The light emitting diode of claim 14, wherein each carbon nanotube group comprises a plurality of carbon nanotubes intersected with the first direction.

18. A light emitting diode comprising:
a first semiconductor layer;
an active layer;
a second semiconductor layer;
a first electrode electrically connected to the first semiconductor layer;
a second electrode electrically connected to the second semiconductor layer,
wherein the active layer is located between the first semiconductor layer and the second semiconductor layer, the second semiconductor layer comprises a light emitting surface, the second electrode is located on the light emitting surface and comprises a treated patterned carbon nanotube film, and the treated patterned carbon nanotube film comprises:
at least two carbon nanotube linear units spaced from each other; and
a plurality of carbon nanotube groups spaced from each other, located between the at least two carbon nanotube linear units, and combined with the at least two carbon nanotube linear units, and a distance between adjacent carbon nanotube groups located between the at least two carbon nanotube linear units is larger than 1 millimeter.

* * * * *